(12) United States Patent
Paire et al.

(10) Patent No.: US 10,770,611 B2
(45) Date of Patent: Sep. 8, 2020

(54) PHOTOVOLTAIC DEVICE AND ASSOCIATED FABRICATION METHOD

(71) Applicants: ELECTRICITE DE FRANCE, Paris (FR); CENTRE NATIONAL DE LA RECHERCHE SCIENTIFIQUE—CNRS-, Paris (FR)

(72) Inventors: Myriam Paire, Paris (FR); Florian Proise, Paris (FR); Daniel Lincot, Antony (FR); Jean-Francois Guillemoles, Paris (FR); Jean-Luc Pelouard, Paris (FR); Sebastien Jutteau, Marly le Roi (FR)

(73) Assignees: ELECTRICITE DE FRANCE, Paris (FR); CENTRE NATIONAL DE LA RECHERCHE SCIENTIFIQUE—CNRS-, Paris (FR)

( * ) Notice: Subject to any disclaimer, the term of this patent is extended or adjusted under 35 U.S.C. 154(b) by 374 days.

(21) Appl. No.: 15/316,265

(22) PCT Filed: Jun. 2, 2015

(86) PCT No.: PCT/FR2015/051460
§ 371 (c)(1),
(2) Date: Dec. 5, 2016

(87) PCT Pub. No.: WO2015/185855
PCT Pub. Date: Dec. 10, 2015

(65) Prior Publication Data
US 2018/0182910 A1    Jun. 28, 2018

(30) Foreign Application Priority Data
Jun. 5, 2014  (FR) ...................................... 14 55122

(51) Int. Cl.
*H01L 31/18* (2006.01)
*H01L 31/054* (2014.01)
*H01L 31/055* (2014.01)

(52) U.S. Cl.
CPC ........ *H01L 31/0547* (2014.12); *H01L 31/055* (2013.01); *H01L 31/18* (2013.01); *Y02E 10/52* (2013.01)

(58) Field of Classification Search
CPC .... H01L 31/0547; H01L 31/055; H01L 31/18
See application file for complete search history.

(56) References Cited

U.S. PATENT DOCUMENTS

2009/0126778 A1 * 5/2009 Brounne ............... H01L 31/055
                                                                136/247
2011/0011449 A1    1/2011 Morgan et al.
(Continued)

FOREIGN PATENT DOCUMENTS

WO    2006/035698 A1    4/2006
WO    2013/183752 A1    12/2013
WO    2014/038568 A1    3/2014

OTHER PUBLICATIONS

Examination Report issued in related application EP 15732840.2, dated Jan. 15, 2018, 5 pages.

*Primary Examiner* — Tae-Sik Kang
(74) *Attorney, Agent, or Firm* — Faegre Drinker Biddle & Reath LLP

(57) ABSTRACT

A photovoltaic device comprising: a plurality of photovoltaic cells, separated from each other; a support receiving the cells; and a light guide in contact with the cells and comprising a primary guide with a surface that is proximal to the cells, where the proximal surface is oriented towards the cells and the support. The photovoltaic device comprises, between the cells, areas located between the support and the primary guide which comprise a material with an index of (Continued)

refraction less than that of the proximal surface, where the material is in contact with the proximal surface.

10 Claims, 2 Drawing Sheets

(56) References Cited

U.S. PATENT DOCUMENTS

2012/0266935 A1\* 10/2012 Haight ................. G02B 3/0056
136/246
2013/0216807 A1\* 8/2013 Wakefield .............. G02B 1/113
428/218

\* cited by examiner

PHOTOVOLTAIC DEVICE AND ASSOCIATED FABRICATION METHOD

CROSS-REFERENCE TO RELATED APPLICATIONS

This application is the U.S. national phase of the International Patent Application No. PCT/FR2015/051460 filed Jun. 2, 2015, which claims the benefit of French Application No. 14 55122 filed Jun. 5, 2014, the entire content of which is incorporated herein by reference.

BACKGROUND

The present invention relates to a photovoltaic device.

This device type is widely used and its purpose is to convert solar energy to electrical energy.

To do that, these devices are provided with photovoltaic cells which will be illuminated by sunlight and convert this light into electrical energy by a photoelectric effect.

In order to improve the yield of this type of device, the use of concentrated light is known; this also has the advantage of reducing the consumption of primary photovoltaic material. To this end, the cells can be coupled to a light guide provided for receiving the photons and for better guiding them to the surface of the photovoltaic cells.

In some of these devices, the cells are arranged on a reflector configured for reflecting photons and allow their recapture by the waveguide. The waveguide is then arranged in contact with this reflector.

However, it was observed that devices of this type had some disadvantages. In fact, the reflectors have a coefficient of reflection that is not ideal and this results in losses on each reflection. Additionally, each reflector generally has local roughnesses, for example because of the roughness of the support on which it is deposited, aging of the reflector or fabrication imperfections. Under some conditions, in particular in terms of dimensions of these roughnesses which are not negligible compared to the wavelength of the photons, these roughnesses produce a local phenomenon of diffusion of the light which induces an uncontrolled variation of the angle of reflection of the photons and therefore an overall reduction of the guiding effect provided by the waveguide.

SUMMARY

The present invention aims to improve the situation.

For this purpose, the invention targets a photovoltaic device comprising:
a plurality of photovoltaic cells, separated from each other;
a support receiving the cells; and
a light guide in contact with said cells and comprising a primary guide with a surface that is proximal to the cells, where the proximal surface is oriented towards the cells and the support.

In particular, the device comprises, between the cells, areas located between the support and the primary guide which comprise a material with an index of refraction less than that of the proximal surface, where the material is in contact with said proximal surface.

In an implementation that is easy to implement, this material is just air and spacing is then provided between the cells.

According to an aspect of the invention, the support is a reflector having a reflecting surface oriented towards the proximal surface of the primary guide.

According to a particular aspect of the invention, the primary guide is a fluorescent concentrator. In this way the guiding effect of the light guide towards the cells can in particular be maximized and the efficiency of the device improved.

According to another aspect of the invention, the support and the proximal surface of the primary guide are separated by a distance included between 1 μm and 20 μm. The nonlinearity effects of the light, which could occur and which would limit the reflection performance, can in particular be limited this way.

In a specific implementation of the invention, the distance between the proximal surface of the primary guide and the support is substantially equal to a multiple of a characteristic wavelength corresponding to a preferred wavelength of emission of the primary guide greater than or equal to two. This makes it possible to limit the aforementioned nonlinearity effects earlier.

According to a particular aspect of the invention, one or more cells are arranged projecting from the support towards the primary guide, where the primary guide is in contact with said cells and kept separated from the support at least by said cells. In that way the cells themselves contribute to forming the areas comprising the material.

In an embodiment, the light guide comprises a plurality of secondary guides separated from each other by said material where each secondary guide is interposed between the proximal surface of the primary guide and a photovoltaic cell. These guides serve in particular to closely select the geometry of the device while also improving the guiding effect of the waveguide by allowing a good optical coupling between the cell and the primary guide and does so even if the surface of the cells is rough.

According to another aspect of the invention, the secondary guides keep the proximal surface of the primary guide away from the support at least in said areas.

In a specific implementation of the invention, each secondary guide has a surface arranged in contact with the surface of the corresponding photovoltaic cell and having dimension substantially equal to the dimensions of the surface of said cell, where said surface of a given secondary guide is arranged substantially edge to edge facing the surface of the corresponding photovoltaic cell. In this way, the exposure of the cells to photons coming from the primary guide can be improved.

According to another aspect of the invention, at least one of the secondary guides has the shape of a pad of generally cylindrical shape where the dimensions of the base the cylinder are substantially equal to those of the surface of the corresponding photovoltaic cell. In particular this has the effect of transferring photons from the primary guide to the cells.

In a specific implementation of the invention, the one or each secondary guide has an index of refraction included between the index of refraction of the primary guide and the index of refraction of the surface of the corresponding photovoltaic cell. In that way, the transfer of photons to the cells is further improved because reflections at the various interfaces between the primary guide, the secondary guide and the cells are minimized.

Additionally, the invention relates to a fabrication method for a photovoltaic device comprising:
a plurality of photovoltaic cells, separated from each other;
a support near which the cells are laid out; and a light guide in contact with said cells and comprising a primary guide with a surface that is proximal to the cells, where the proximal surface is oriented towards the cells and the support.

In particular:

the photovoltaic cells are arranged near the support and the light guide is arranged in contact with the photovoltaic cells by laying out, between the cells, areas located between the primary guide and the support which comprise a material with an index of refraction less than that of the proximal surface, where said material is arranged in contact with said proximal surface.

According to an aspect of the method according to the invention, one or more transparent secondary guides are obtained which are each interposed between the primary guide and one photovoltaic cell. In this way, the geometry of the device can be precisely controlled and nonlinear phenomena can be limited.

In a specific embodiment, each secondary guide is formed by a deposit directly in contact with the corresponding photovoltaic cell. In this way, the fabrication of the device can be made easier and the management of the associated inventory simplified.

According to another aspect of the invention, all or part of the photovoltaic cells are formed by deposition near the support such that the corresponding photovoltaic cells project from the support and the primary guide is deposited in contact with said projecting cells. In that way, the storage constraints due to the parts required for fabrication of the device can be limited. Additionally, the fabrication is simplified because of the reduction of the number of steps needed.

BRIEF DESCRIPTION OF THE DRAWINGS

The invention will be better understood upon reading the detailed description which follows which is given solely as an example and made with reference to the attached Figures, in which.

DETAILED DESCRIPTION

Figure 1:
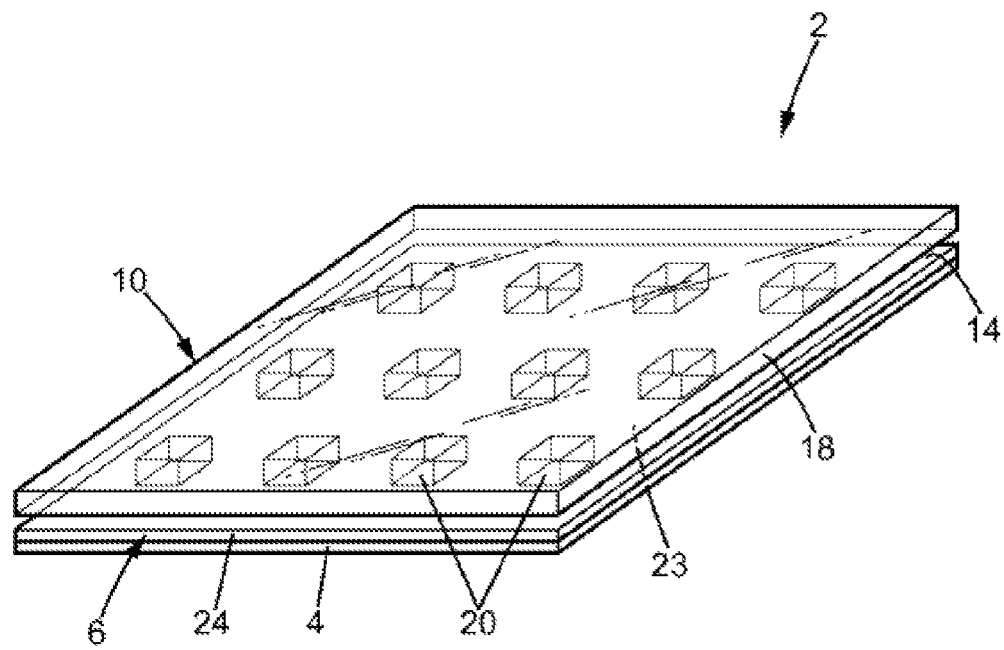
FIG. 1 is a schematic illustration of the photovoltaic device according to the invention.

FIG. 1 shows a photovoltaic device 2 according to the invention, configured for transforming light into electric energy.

Figure 2:
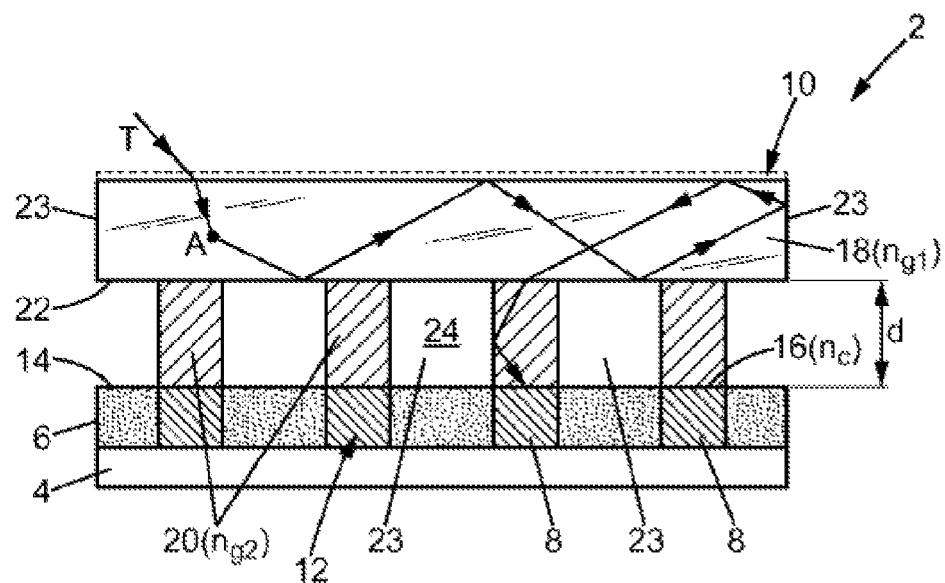
FIG. 2 is a sectional view of the device from FIG. 1.

With reference to FIGS. 1 and 2, the device 2 comprises a substrate 4, a support 6 for the photovoltaic cells 8 and a light guide 10.

The device 2 operates over a range of wavelengths referred to as useful. This range of useful wavelengths is defined as the spectral range of photons that the cells 8 are capable of converting into electricity. The upper end of this range therefore depends on the nature of the photovoltaic cells 8 and more precisely the nature of the material making up the absorbers of these cells. The lower end of this range is commonly set at 350 nm because there are nearly no photons with a wavelength below 350 nm arriving on Earth.

For example, this range is from 350 nm to 1200 nm.

The general shape of the substrate 4 is a rectangular plate. It is made for example by known methods. The substrate 4 is in contact with the support 6 and supports the support 6.

In an embodiment, the substrate 4 is provided with electrical contacts (not shown) configured for connecting all the photovoltaic cells 8 individually or in a network to an external circuit.

The general shape of the substrate 6 is a rectangular plate. The lateral and transverse dimensions thereof correspond substantially to that of the substrate. The support 6 is arranged on the substrate 4 and substantially parallel to the substrate 4. The substrate 4 and the support 6 are arranged substantially edge to edge.

The support 6 receives the cells 8. In the embodiment from FIGS. 1 and 2, the support 6 is provided with cavities 12 which open out and whose respective openings are oriented away from the substrate 4. Each cavity 12 receives a photovoltaic cell 8. The cavities 12 have dimensions substantially complementarity to that of the photovoltaic cells 8. The cavities 12 and therefore the cells 8 are spaced apart from each other on the support. The spacing between the cells should be regular for the optimal performance of the device 2. For example, the cavities 12 and therefore the cells 8 are arranged in a matrix pattern on the surface of the support 6, meaning in regularly spaced rows and columns on this surface. Nevertheless, in some embodiments, the spacing is less regular or even random. This serves in particular to make fabrication of the device 2 easier.

According to an implementation variant, the cells are disposed directly on the surface of the support and the support does not have cavities 12. The invention is subsequently described without limitation for embodiments in which the support has cavities 12.

Additionally, several implementations of the support 6 are conceivable.

In one implementation, the support 6 is a reflector. The reflector 6 has an upper surface (in the direction of the orientation of the Figures). This upper surface is a reflecting surface 14 oriented away from the substrate 4. More precisely, the reflecting surface 14 is oriented towards the light guide 10. The cavities 12 open out through the reflecting surface 14.

The reflector 6 is for example implemented conventionally. For example, the reflecting surface 14 includes a silver Ag or aluminum Al layer formed before or after the placement of the cells 8 and on which is optionally deposited a zinc oxide ZnO layer with or without aluminum doping.

In some embodiments, the reflecting surface 14 is configured to reflect only a portion of the visible domain. Advantageously, the wavelength range that the reflecting surface 14 is configured to reflect includes all or part of the emission wavelength range of a primary guide of the light guide 10. For example, it is chosen to include all of this emission wavelength range.

This primary guide and the emission wavelength range thereof are described below.

This is advantageous in some types of applications, in particular in the implementation of window panes, and a device having low optical losses in the context of these applications can be obtained.

In some implementations, the substrate 4 is itself transparent at wavelengths which are not reflected by the support 6.

In some specific implementations, the support 6 is alternately or parallelly reflecting in a wavelength range chosen from the visible domain such that the device has an outside appearance with a hue depending on said selected wavelength range.

In implementations in which the support 14 is reflecting in a portion of the visible domain including all or part of an emission wavelength range of the primary guide, the chosen range associated with the shade in question is for example chosen to be disjoint from the emission wavelength range of the primary guide.

In some embodiments, the reflecting surface 14 is configured to reflect the entire visible domain.

In another implementation, the support 6 has the same geometry as before. However, the support 6 does not have a reflecting surface, meaning that the upper surface of the support is not reflecting. The support 6 is made up for example of a material transparent in the visible domain. It is made for example from glass. Advantageously, the substrate 4 is itself transparent, so as to make the entire device the most transparent possible. This is particularly advantageous for some applications, such as windowpanes for construction, in which this transparency is an important criterion.

The following description is given without limitation for the scenario where the support 6 is a reflector; the application to a support of another type, for example a transparent support, is immediate.

As previously indicated, the cells 8 are arranged respectively in one of the cavities 12 of the reflector 6. Each cell 8 has an upper surface 16 oriented towards the light guide 10 and via which the photons coming from the light guide 10 that the cell transforms into electric energy are received. The cells 8 are disposed in the cavities 12. For example the surfaces 16 of the cell 8 are substantially coplanar with each other and/or coplanar with the reflecting surface 14 of the reflector 6. For example, the cells are flush mounted in the reflector. In that way, the upper surfaces 16 of the cells are leveled near the reflecting surface 14. Alternatively, the surfaces 16 of the cells 8 are not mutually coplanar. Furthermore, in some embodiments, they are recessed in their respective cavity 12, meaning their surface 16 is at a lower level than that of the associated opening of the cavity 12. In other embodiments described below, the cells protrude from their cavity and the reflector.

The upper surface 16 of the cells 8 is substantially flat. The upper surface 16 of the cells 8 has an index of refraction $n_c$. The index of refraction $n_c$ is substantially equal to 1.9, for example. The upper surface 16 includes for example a conducting transparent oxide layer. This oxide can be zinc oxide ZnO, transparent, doped with aluminum, or indium and tin oxide ITO, or tin oxide $SnO_2$.

In an embodiment, the cells 8 are microcells.

Advantageously, the cells 8 have a generally cylindrical shape and their respective upper surface 16 is circular. The diameter of the cells is then for example included between 10 μm and 500 μm.

Note that "cylinder" is understood to mean a surface defined by a generator passing through a variable point describing a closed planer curve, or directing curve, while keeping a fixed direction. In that way, a cylindrical shape is not necessarily rotationally symmetric.

In some embodiments, such as the one from FIG. 1, the cells have a general cylindrical shape with rectangular section as shown on FIG. 1. The cells 8 then half a width and/or length measured in the plane of their upper surface 16 included between 10 μm and 500 μm.

Alternatively, the cells have shapes and respective upper surfaces 16 of arbitrary shape. The cells are for example inscribed in a cylinder with circular section and diameter included between 10 μm to 500 μm.

The cells 8 are, for example, thin layer cells, which can have advantages in terms of ease of fabrication. For example, they are of the type referred to as CIGS (for Cu, In, Ga and Se) and their composition is $Cu(In, Ga)Se_2$, meaning they are made from copper, indium, gallium and selenium. They can also be CdTe or CZTS type, which are other thin layer cells.

Nonetheless, the invention is not limited to a specific type of cell. The cells can be chosen arbitrarily among the existing cells. For example, the cells could be crystalline, polycrystalline or amorphous silicon, or cells of type III-V semiconductor, like for example GaAs, le GaInP ou le GaInAs.

The light guide 10 is configured to receive photons and guide them to the cells 8. The light guide 10 is common to the cells 8. Additionally, it is in contact with all cells 8. The light guide is configured to guide photons therewithin to the upper surface 16 of the cells 8.

The light guide 10 comprises a primary guide 18 and a plurality of secondary guides 20.

The primary guide 18 is a fluorescent concentrator. It is configured to absorb and re-emit photons in response to photons at another wavelength. This is described in more detail later.

The general shape of the primary guide 18 is a flat rectangular plate. This configuration makes assembly of the device easy and reduces the bulk of the device.

This primary guide 18 has for example a thickness of order a millimeter or even a centimeter.

The primary guide 18 is disposed substantially parallel to the reflecting surface 14 of the reflector 6.

The primary guide 18 has a surface 22 proximal to the cells 8 which is oriented towards the reflector 6. With reference to the orientation in FIGS. 1 and 2, the proximal surface 22 corresponds to the lower surface of the primary guide 18. As shown on the FIGS. 1 and 2, the reflecting surface 14 of the reflector 6 is oriented towards the proximal surface 22.

The proximal surface 22 and the reflecting surface 14 of the reflector 6 are substantially parallel.

The primary guide 18 has longitudinal and transverse dimension substantially equal to that of the reflector 6. More precisely, the dimensions of the primary guide, the reflector and the substrate are dependent on the application of the device 2. For example, the proximal surface area 22 of the guide (and therefore the area of the reflector and the substrate) is of order tens of square centimeters for some applications or of order a square meter for other applications. The ratio of the proximal surface area 22 to the sum of the upper surface areas 16 of the cells 8, also known under the name of geometric gain of the device 2, is for example included between 2 and 100 and is for example 20.

Advantageously, the cells 8 are facing the central part of the primary guide 18. This allows adjustment of the dimensions of the primary guide 18 without having to modify the arrangement of the cells 8 near the support 6.

Advantageously, the cells 8 are thus arranged near the support 6 opposite the primary guide 18 in a way that the upper surface 16 thereof is not facing a lateral end of the primary guide 18, meaning edges delimiting the lateral surfaces 23 (FIG. 2) of the primary guide 18.

The primary guide 18 comprises at least one dye and also a material forming the majority of the primary guide and in which the or each coloring is immersed and homogeneously distributed. The dye is phosphorescent or florescent, meaning a material which absorbs light in a first wavelength range, called absorption range of the device 2. In response, it re-emits within it and principally isotropically photons in a second wavelength range or emission wavelength range. This range is centered on a characteristic wavelength $\lambda$ of the device 2.

The absorption wavelength range designates the spectral range of the photons that the dye is capable of absorbing. Ideally, the lower limit thereof corresponds to the lower limit of the useful wavelength range, and the upper limit thereof is slightly below that of the useful wavelength range.

The emission wavelength range designates the spectral range of the photons emitted by the dye. This range is offset towards longer wavelengths compared to the absorption range. It must ideally have an upper limit coinciding with that of the useful wavelength range. Additionally, this range is generally narrow, such that the range can be associated with and is centered around a specific wavelength—the characteristic wavelength $\lambda$. As will be seen subsequently, this characteristic wavelength $\lambda$ is used to define the height of the secondary guides included in the device 2 and also the spacing between the primary guide and the reflector. The characteristic wavelength $\lambda$ of the device 2 is a function of the primary guide 18 and the dye(s) that it contains. It is chosen for being included in a spectral range where the photovoltaic cells 8 perform well.

The absorption wavelength range and the emission wavelength range generally have a shared frequency range. However, this shared range is preferably as narrow as possible. This serves to limit the phenomenon of reabsorption by the waveguide 18 of photons emitted by the primary guide 18 itself since these reabsorptions result in losses.

The reflecting surface 14 of the reflector 6 is chosen for optimally reflecting photons having a wavelength included in the emission wavelength range of the primary guide.

Preferably the phosphorescence yield of the dye, meaning the ratio of the number of photons re-emitted by the dye to the number of photons absorbed, is over 90% and advantageously 95%.

In a first variant, the primary waveguide is composed of one or more polymers doped by one or more dyes. For example, the primary guide is made from poly methyl methacrylate or PMMA. In some of embodiments, the dye is implemented from organic molecules such as for example Lumogen®, sold by BASF, and is for example Lumogen® RED 305. Alternatively, the dye is made from rhodamine, perylene, 4-butylamino-N-allyl-1,8-naphthalimide, poly(9, 9-di-(2-ethylhexyl)-9H-fluorene-2,7-vinylene, poly((9,9-di-(2-ethylhexyl)-9H-fluorene-2,7-vinylene)-co-(1-methoxy-4-(2-ethylhexyloxy)-2,5 or chelates of lanthanide ions.

Alternatively, the dye is made from semiconductor nano crystals (known in English as "quantum dots"), such as for example nanoparticles of PbS or PbSe or core/shell type structures of CdSe/ZnS, CdSe/CdS, CdSe/CdS/CdZnS/ZnS or CdTe/CdSe.

Alternatively, the dye is made from organic/inorganic hybrid compounds.

In some embodiments, the dye is made from several elements described above, which serves to expand the absorption range of the concentrator.

According to another variant, the primary guide is an oxide doped with luminescent elements.

In other embodiments, the dye is implemented from nanoparticles of oxides doped with rare earth metals, like yttrium orthovanadate doped with europium or oxides doped with neodymium (Nd3+) or ytterbium (Yb3+) or doped with other rare earth metals, for example with lanthanides.

The primary guide 18, and therefore the proximal surface 22 thereof, have an index of refraction $n_{g1}$. The index of refraction $n_{g1}$ is substantially equal to 1.5, for example.

According to the invention, the proximal surface 22 of the primary guide 18 is away from the reflector 6. The device 2 comprises one or more areas 23 located between the cells and comprising a material 24 with an index of refraction less than that of the proximal surface 22 of the primary guide 18. The material 24 fills the delimited space between the reflector 6 and the primary guide 18 and extends between the cells 8. The one or more areas 23 are located between two portions belonging respectively to the primary guide 18 and to the reflector 6 and which are opposite one another.

Preferably, the material 24 has the smallest possible index of refraction. The preferred material 24 is therefore air (with an index of refraction equal to 1).

The effect of the presence of material 24 is to induce a Fresnel reflection at the interface between the primary guide 18 and the material 24, meaning near the proximal surface 22. This reflection is specular and the efficiency is substantially equal to 100% for photons with an angle of incidence greater than or equal to a critical angle. One then talks about total internal reflection, TIR. The value of this angle then depends only on the indices of refraction of the materials forming the interface, meaning the primary guide 18 and the material 24. For the phenomenon of total internal reflection to occur, the light has to pass from a high index medium to a lower index of refraction medium, which explains the addition of the material 24 below the primary guide. In the implementations where the material 24 is air and the material of the primary waveguide has an index of refraction of 1.5 then the critical angle is substantially 42°, which corresponds to 75% of the incident photons subsequently reflected by TIR and 25% of the photons not reflected assuming isotropic emission, which is the case here.

Preferably, the material 24 has an index of refraction equal or substantially equal to 1. This has the effect of minimizing the value of the critical angle and therefore maximizing the proportion of photons reflected by total internal reflection.

As a variant, the material 24 is a porous material, for example made of $SiO_2$ or $TiO_2$ nanostructures, so as to minimize the effective index of refraction. Alternatively, the material 24 is made from a polymer with an index of refraction less than 1.4 and equal to 1.3, for example. In another variant, the material 24 is made from magnesium fluoride $MgF_2$ or even silicon oxide $SiO_2$.

Preferably, the distance $\underline{d}$ between the proximal surface 22 of the primary guide 18 and the support 6 is greater than or equal to the characteristic wavelength $\lambda$ of the device 2. The effect of this is to minimize the nonlinear effects of the behavior of the photons induced because this distance can not be negligible compared to the wavelength of the photons after their emission by the primary guide 18. Preferably the distance $\underline{d}$ between the proximal surface 22 and the reflector 6 is greater than or equal to a multiple of the characteristic wavelength $\lambda$ which is strictly greater than 1. This makes it possible to minimize the aforementioned nonlinearity effects earlier. For example, the characteristic wavelength of the device 2 can be about 1 μm and the distance between the proximal surface 22 and the reflector 6 is for example taken greater than or equal to two, three or four times this wavelength and is for example 5 μm.

Additionally, preferably, the distance between the proximal surface 22 and the reflector 6 is less than or equal to a few times the characteristic wavelength λ of the device 2, for example 20 times this wavelength. This serves in particular to limit the phenomena of photon loss by the sides of the secondary guides 20 and also to minimize the probability of the occurrence of reflections near lateral surfaces of the secondary guides 20 as will be seen subsequently. Thus, for example, the distance between the proximal surface 22 and the reflector 6 is taken less than or equal to 20 μm and is, for example, included between 5 μm and 10 μm.

Preferably, the zones 23 form a single area 23 which is continuous and in contact with the proximal surface 22 over substantially the entire surface of the proximal face 22 which is not facing a secondary guide 20. The effect of this is to improve the efficiency of the reflections over a surface of maximum area.

The secondary guides 20 are transparent. They are respectively associated with one of the cells 8. Preferably, the secondary guides 20 are identical to each other. This makes it easy to fabricate them and therefore to fabricate the device 2 in general.

Each secondary guide 20 has the shape of a pad. Each secondary guide 20 is interposed between a proximal surface 22 of the primary guide 18 and the upper surface 16 of a cell 8. The secondary guides 20 keep the proximal surface 22 of the primary guide 18 away from the reflector 6. The secondary guides 20 are separated from each other laterally by the material 24.

Preferably, each secondary guide 20 has a surface, or base, in contact with the associated cell 8 which has a shape substantially identical to that of the upper surface 16 of the cell 8. This has the effect of maximizing the percentage of photons which pass from the primary guide 18 to the secondary guides 20 and from the secondary guides 20 to the cells 8. For example, each secondary guide has a generally cylindrical or prismatic shape of arbitrary section and whose base has a shape substantially identical to that of the upper surface 16 of the associated cell 8. For example, as shown in FIG. 2 for cells 8 with rectangular upper surface 16, each secondary guide 20 has a right prismatic shape with rectangular section having dimensions substantially identical to that of the upper surface 16 of the cells. Alternatively, for cells 8 with cylindrical shape and circular section, the secondary guides 20 also have a generally cylindrical shape with a circular section.

Alternatively, the secondary guides 20 can have concave or convex sides, with a trapezoidal or other shape.

Each secondary guide 20 is arranged in contact with the upper surface 16 of the associated cell 8 with the base of the secondary guide 20 arranged in contact with the upper surface 16 and edge to edge, as shown in FIGS. 1 and 2.

The secondary guides 20 are for example made from a photosensitive resin. For example, the photosensitive resin is the resin sold under the name AZ® nLOF™ 2070 by MicroChemicals or the resin 40XT or the resin SU8.

The secondary guides 20 have an index of refraction $n_{g2}$. The index of refraction $n_{g2}$ is greater than the index of refraction $n_{g1}$ of the primary guide 18. Additionally, the index of refraction $n_{g2}$ of the secondary guides 20 is less than the index of refraction $n_c$ of the upper surfaces 16 of the cells 8. The effect of this is to enhance the transfer of photons towards the cells 8, since the secondary guides provide an anti-reflection for the cells because of their intermediate index between the index of the primary guide and that of the cells.

Preferably, the index of refraction $n_{g2}$ of the secondary guides 20 is substantially equal to the geometric average of the index of refraction $n_{g1}$ of the primary guide 18 and the index of refraction $n_c$ of the upper surfaces 16 of the cells 8. This has the effect of simultaneously enhancing the transfer of photons from the primary guide 18 to the secondary guides 20 and the transfer of photons from the secondary guides 20 to the cells 8. In other words, this is the preferred relation:

$$n_{g2} \cong \sqrt{n_{g1} * n_c}$$

For example, the index $n_{g1}$ is substantially 1.5 and the index $n_c$ is substantially 1.9. Preferably, the index $n_{g2}$ is then substantially 1.69.

The principle of operation of the device 2 is now going to be described with reference to FIGS. 1 and 2.

During operation of the device 2, the primary guide 18 is illuminated by photons coming from the environment thereof.

Referring to FIG. 2 which shows a sample optical path T, the photons around the device 2 enter into the primary guide 18. As previously indicated, they are absorbed by the primary guide 18. Some photons for example are absorbed near the point A within the thickness of the primary guide 18. In response, the primary guide 18 isotropically emits photons from the point A in the primary guide 18, meaning in all directions. These photons are emitted at a wavelength belonging to the primary guide emission range 18.

Once emitted within the primary guide 18, these photons move in it towards an interface of the primary guide 18.

The photons coming to a zone of the proximal surface 22 facing a secondary guide 20 pass into the secondary guide and then, all or part thereof, arrive at the upper surface 16 of the associated cell 8, as described below.

As shown by the optical path T, the photons arriving near an interface of the primary guide 18 in an area which is not facing a secondary guide 20 are reflected. More specifically, as is well known, on each reflection, only a portion of the photons are reflected, the other portion of these photons escape from the primary guide 18. For reflections occurring near the proximal face 22, the photons which are not reflected propagate towards the reflector 6 where they are reflected towards the primary guide 18. There they enter it and propagate in it again.

According to the invention, as previously indicated, the proportion of the photons effectively reflected near the proximal surface 22 is increased because of the presence of areas 23 comprising the material 24. In fact, in a scenario in which the reflector is positioned directly under the primary guide 18, all the rays would be reflected with the coefficient of reflection of the reflector, which is not perfect. With the presence of material 24, a large portion of the rays are perfectly reflected by total internal reflection. Those which escape encounter the reflector 6 and are therefore reflected at the rate of the reflecting surface thereof and reenter into the primary guide again.

The movement of the photons in the primary guide 18, whether or not following one or more reflections on the reflecting surface 14 of the reflector, continues until arriving within the primary guide 18 near the proximal surface 22 in a zone located facing the secondary guide 20. Because the values of the indices of refraction $n_{g1}$, $n_{g2}$ and $n_c$, the photons enter into the secondary guide 20 in question in which they move towards the corresponding cell 8. Depending on the angle at which a photon enters a secondary guide 20, it can be subject to one or more reflections near the lateral side of the secondary guide 20. As before, only a portion of the photons undergoing these reflections are effectively reflected since another portion passes into the material 24. Depending on the path thereof and the position thereof in the device 2, in particular the proximity thereof to an edge of the device 2, once they have left the secondary guide 20, these photons enter into another secondary guide 20 (with or without reflection by the reflector 6), enter the primary guide 18 again (after reflection on the reflector 6) or escape from the device 2 (with or without reflection on the reflector 6). The photons reaching the upper surface 16 of a cell 8 are then converted into electrical energy by the cell 8.

In the embodiments in which the support 6 is only reflecting for a portion of the spectrum, the photons whose wavelength is located in the range of wavelengths reflected by the support 6 behave as described above. The photons with a wavelength which is not reflected by the support are then not reflected by the support and escape from the device during operations thereof.

In the embodiments in which the support 6 is transparent, the photons are not reflected by the support 6 during operation of the device.

The fabrication of the device 2 is now going to be described with reference to FIGS. 1 and 2.

In a first step, the substrate 4, support 6 and cells 8 are fabricated by any known method and they are arranged as previously described. In other words, the support 6 is arranged on the substrate 4 and the cells 8 are placed near the support 6.

In some embodiments, the upper surface 16 of the cells 8 include a layer of zinc oxide ZnO doped with aluminum Al. In the corresponding embodiments, this layer is deposited on the cells 8 once they are arranged near the support, either selectively only on the cells 8 or both on the cells 8 and on the reflecting surface 14 of the reflector 6.

Additionally, the secondary guides 20 are fabricated, for example, by optical photolithography. The positioning of the secondary guides is then done during the photolithography. Finally, the proximal surface 22 of the primary guide 18 is arranged in contact with the free end of the secondary guides 20. Optionally, a final annealing is also done in order to rigidly join the secondary guides 20 to the primary guide 18, which improves the mechanical strength of the device 2.

As a variant, all or part of the secondary guides 20 are formed directly in contact with the cells 8 by electrochemical means. More specifically, after laying out the cells 8 on the reflector 6, secondary guides 20 are made by electrodeposition of zinc oxide ZnO that is selectively deposited on the surface of the cells 8.

In the corresponding embodiments, the secondary guides 20 formed directly on the cells 8 are made of zinc oxide ZnO.

The device 2 according to the invention was implemented with a geometric gain of order 20. It was thus observed that the concentration factor of the device was three times better than a device from the state-of-the-art. For example, the concentration factor of the device from the state-of-the-art in which the primary guide is adhered to the reflector was measured at 1.8 as compared to the concentration factor of the device 2 according to the invention which was measured at 5.3.

This is explained by the direct efficiency gain arising from the improvement of the efficiency of the reflections near the proximal surface 22 of the primary guide 18 and also from an indirect efficiency gain near the upper surface of the primary guide 18 resulting from the specular nature of the reflections near the proximal surface 22 for photons arriving with an angle of incidence sufficient for being reflected by total internal reflection.

Figure 3:
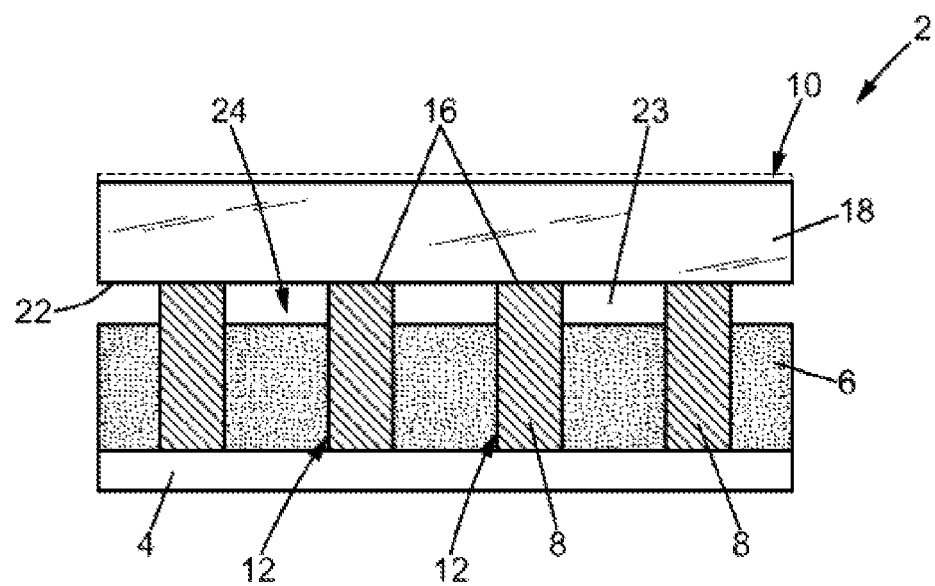
FIG. 3 is a sectional view of the device according to a first variant of the invention.

With reference to FIG. 3, in a variant of the invention, the cells 8 project from the reflector 6 towards the primary guide 18. The proximal surface 22 is arranged directly in contact with the cells 8. In other words, the device 2 does not have a secondary guide 20. The cells 8 keep the primary guide 18 away from the reflector 6.

In this embodiment, the cells 8 are formed for example directly in the cavities 12 of the reflector 6, for example by deposition. Alternatively, they are formed directly on the reflector 6 which does not have cavities 12. During fabrication of the device 2, the reflecting surface 14 of the reflector 6 is formed for example after formation of the cells 8 by deposition. This serves to minimize the impact of cell 8 formation on the quality of the reflecting surface 14 of the reflector 6.

Because it does not have a secondary guide 20, the device 2 according to this variant has a lower cost and is easier to manufacture.

Figure 4:
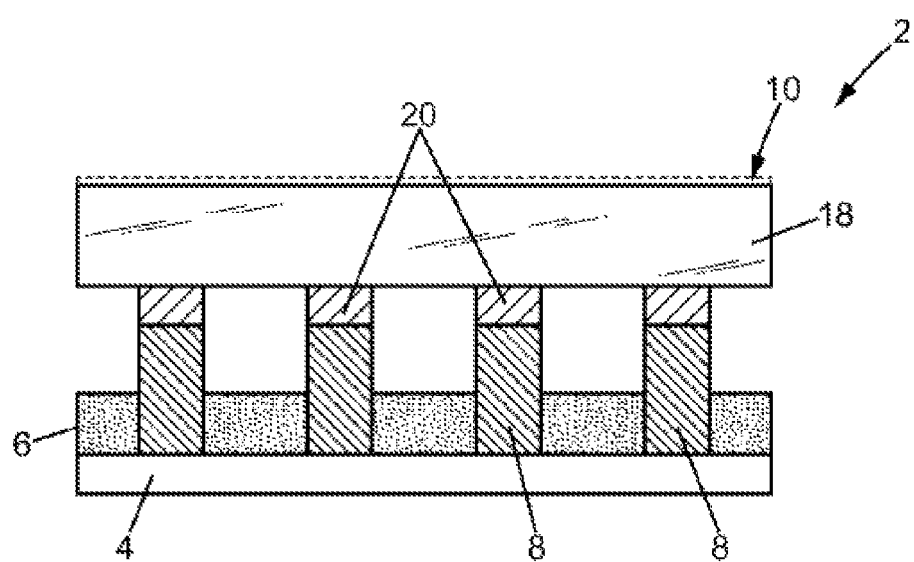
FIG. 4 is a sectional view of the device according to a second variant of the invention.

Referring to FIG. 4, in another embodiment, the cells 8 project from the reflector 6 and the device 2 includes secondary guides 20 such as previously described. The dimensions of the secondary guides 20 can be limited and therefore fabrication of the device 2 also simplified because of the projection of the cells 8 in this embodiment.

In another variant (not shown), the embodiments described above are combined. For example, the upper surface of some cells 8 are leveled near the reflecting surface of the reflector 6 such as shown in FIG. 2 whereas other cells project out of the reflector. The device 2 then comprises secondary guides 20 of a first size interposed between the cells 8 whose upper surface is leveled and the proximal surface 22 of the primary guide, and secondary guides 20 of a second size interposed between the projecting cells and the proximal surface. The peaks of all the secondary guides are then substantially the same height with the primary guide in contact with each of them.

In another example of this variant, the primary guide 18 is arranged in direct contact with the cells projecting out of the reflector. Further, the cells 8 whose upper surface is flattened are then each coupled to a secondary guide 20 such as previously described and interposed between the cell 8 in question and the proximal surface 22.

Other embodiments of the device 2 according to the invention are also conceivable.

For example, in some embodiments, the upper surface of the primary guide 18 is covered with a bandpass filter (dashed in FIG. 2) configured for allowing maximum passage of surrounding photons into the primary guide 18 but for blocking the exit of photons by the upper surface of the primary guide 18 in particular photons reemitted by the primary guide 18 and having a wavelength in the emission range of the primary guide. Thus the filter has good properties for reflection of photons having wavelengths located around the characteristic wavelength and a high transmission for other wavelengths.

Additionally, among the optical mechanisms with which to concentrate the light on the photovoltaic devices, imaging devices are noted, which serve to obtain an image of the object through the optical system thereof and therefore in this case an image of the sun on the cell, and non-imaging devices, which for their part concentrate the light without forming an image.

The imaging devices have the specific feature of only concentrating sunlight if it arrives directly on the device in question, meaning if it is oriented along the axis formed by the sun and the optical device, and being unable to use diffuse light, which arrives along arbitrary directions, for example because of diffusion phenomena generated by clouds.

The non-imaging devices are insensitive to the direction of the incident solar light and therefore have the advantage of not having to precisely follow the course of the sun with special systems.

Also, preferably, the device 2 is a non-imaging device. It is then attached to the support thereof in a non-mobile manner. This serves to free the device from an orienting mechanism configured for orienting it according to the course of the sun, which is necessary for imaging devices. The cost of the device 2 is therefore substantially reduced compared to an imaging device.

The invention claimed is:

1. A photovoltaic device comprising:
    a plurality of photovoltaic cells, separated from each other;
    a support receiving the cells; and
    a light guide in contact with the cells and comprising a primary guide with a proximal surface that is proximal to the cells, where the proximal surface is oriented towards the cells and the support,
    wherein the photovoltaic device comprises, between the cells, areas located between the support and the primary guide which comprise a material with an index of refraction less than that of the proximal surface, where the material is in contact with the proximal surface,
    wherein the support and the proximal surface of the primary guide are separated by a distance between 1 µm and 20 µm;
    wherein the light guide comprises a plurality of secondary guides separated from each other by the material where each secondary guide is interposed between the proximal surface of the primary guide and a photovoltaic cell; and
    wherein each secondary guide is in direct contact with a photovoltaic cell at one extremity of each secondary guide and in direct contact with the proximal surface of the primary guide at another extremity of each secondary guide.

2. The photovoltaic device according to claim 1, wherein the support is a reflector having a reflecting surface oriented towards the proximal surface of the primary guide.

3. The photovoltaic device according to claim 1, wherein the primary guide is a fluorescent concentrator.

4. The photovoltaic device according to claim 1, wherein the distance between the proximal surface and the support is substantially equal to a multiple of a characteristic wavelength of the device, said characteristic wavelength corresponding to a preferred wavelength of emission of the primary guide, said multiple being greater than or equal to two.

5. The photovoltaic device according to claim 1, wherein one or more photovoltaic cells are arranged projecting from the support towards the primary guide, where the primary guide is in contact with the cells and kept separated from the support at least by the cells.

6. The photovoltaic device according to claim 1, wherein the material is air.

7. The photovoltaic device according to claim 1, wherein the plurality of secondary guides keep the proximal surface of the primary guide away from the support at least in the areas.

8. The photovoltaic device according to claim 1, wherein each secondary guide has a surface arranged in contact with a surface of a corresponding photovoltaic cell and having dimension substantially equal to dimensions of the surface of said corresponding photovoltaic cell, where a surface of each secondary guide is arranged substantially edge to edge facing the surface of the corresponding photovoltaic cell.

9. The photovoltaic device according to claim 1, wherein at least one of the plurality of secondary guides has a shape of a pad of generally right prismatic shape where dimensions of a base of a cylinder are substantially equal to those of a surface of a corresponding photovoltaic cell.

10. The photovoltaic device according to claim 1, wherein one or each secondary guide has an index of refraction included between an index of refraction of the primary guide and an index of refraction of a surface of a corresponding photovoltaic cell.

* * * * *